(12) United States Patent
Lin et al.

(10) Patent No.: US 11,017,830 B1
(45) Date of Patent: May 25, 2021

(54) FERROELECTRIC MEMORIES

(71) Applicant: Industrial Technology Research Institute, Hsinchu (TW)

(72) Inventors: Yu-De Lin, Taoyuan (TW); Heng-Yuan Lee, Hsinchu County (TW); Po-Chun Yeh, Taichung (TW); Hsin-Yun Yang, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/907,101

(22) Filed: Jun. 19, 2020

(30) Foreign Application Priority Data

Dec. 6, 2019  (CN) .......................... 201911243677.7

(51) Int. Cl.
  *G11C 11/22* (2006.01)
(52) U.S. Cl.
  CPC .................... *G11C 11/22* (2013.01)
(58) Field of Classification Search
  CPC ....................................... G11C 11/22
  See application file for complete search history.

(56) References Cited

U.S. PATENT DOCUMENTS

| | | | | |
|---|---|---|---|---|
| 6,110,582 A * | 8/2000 | Wu | ........................ | G11B 5/7373 428/332 |
| 6,221,481 B1 * | 4/2001 | Wu | .................... | G11B 5/73919 428/332 |
| 7,485,473 B2 * | 2/2009 | Tamura | .................. | H01L 21/321 438/253 |
| 7,763,921 B2 | 7/2010 | Wang | | |
| 9,231,206 B2 | 1/2016 | Tao et al. | | |
| 10,403,630 B2 | 9/2019 | Tao et al. | | |
| 2002/0153543 A1 * | 10/2002 | Kijima | .............. | H01L 21/02271 257/296 |
| 2005/0072996 A1 * | 4/2005 | Kijima | .............. | H01L 21/02197 257/295 |
| 2006/0175644 A1 * | 8/2006 | Ko | ....................... | G11C 11/5657 257/295 |
| 2008/0062615 A1 * | 3/2008 | Rappe | ...................... | H01G 4/10 361/321.5 |
| 2014/0355328 A1 | 12/2014 | Myller et al. | | |

(Continued)

FOREIGN PATENT DOCUMENTS

| | | |
|---|---|---|
| CN | 109037219 A | 12/2018 |
| TW | I611515 B | 1/2018 |

OTHER PUBLICATIONS

Mayrhofer, P.H., et al., "A comparative study on reactive and non-reactive unbalanced magnetron sputter deposition of TiN coatings", Thin Solid Films 415, 2002, pp. 151-159, Elsevier, US.

(Continued)

*Primary Examiner* — Khamdan N. Alrobaie

(57) ABSTRACT

A ferroelectric memory is provided. The ferroelectric memory includes a first electrode layer having a dominant crystallographic orientation of (110) or (220), a second electrode layer opposite the first electrode layer, wherein the second electrode layer has a dominant crystallographic orientation of (110) or (220), and a ferroelectric layer disposed between the first electrode layer and the second electrode layer, wherein the ferroelectric layer has a dominant crystallographic orientation of (111).

23 Claims, 5 Drawing Sheets

(56) References Cited

U.S. PATENT DOCUMENTS

| | | | |
|---|---|---|---|
| 2015/0076437 A1* | 3/2015 | Tao .................... | H01L 45/1253 |
| | | | 257/4 |
| 2016/0358639 A1* | 12/2016 | Jiang .................... | G11C 11/221 |
| 2017/0162250 A1 | 6/2017 | Slesazeck et al. | |
| 2017/0186757 A1 | 6/2017 | Tao et al. | |
| 2017/0256552 A1 | 9/2017 | Schroder et al. | |
| 2018/0350824 A1 | 12/2018 | Tao et al. | |
| 2020/0194443 A1* | 6/2020 | Lin .................. | H01L 27/11507 |

OTHER PUBLICATIONS

Tang, Y.-C., et al., "A Comprehensive Kinetical Modeling of Polymorphic Phase Distribution of Ferroelectric Dielectrics and Interfacial Energy Effects on Negative Capacitance FETs", Symposium on VLSI Technology Digest of Technical Papers, 2019, 2 pages, US.

Park, Min Hyuk, et al. "Evolution of phases and ferroelectric properties of thin Hf0.5Zr0.5O2 films according to the thickness and annealing temperature", Applied Physics Letters, 2013, 6 pages, AIP Publishing LLC, US.

Böscke, T. S., et al. "Phase transitions in ferroelectric silicon doped hafnium oxide" Applied Physics Letters, 2011, 4 apges, AIP, US.

Lowther, J. E., et al. "Relative stability of ZrO2 and HfO2 structural phases" Physical Review B, Dec. 1999, 4 pages, vol. 60, No. 21, The American Physical Society, US.

Taiwan Patent Office, Office Action, Patent Application Serial No. 109111263, dated Feb. 5, 2021, Taiwan.

* cited by examiner

FERROELECTRIC MEMORIES

CROSS REFERENCE TO RELATED APPLICATIONS

This Application claims priority of China Patent Application No. 201911243677.7, filed on Dec. 6, 2019, the entirety of which is incorporated by reference herein.

TECHNICAL FIELD

The disclosure relates to ferroelectric memory, and in particular it relates to a ferroelectric memory with electrode layers having a specific crystallographic orientation.

BACKGROUND

Ferroelectric memory is a type of destructive read memory that requires a large number of operations. Therefore, it is valuable to know how to increase the number of operations. Conventional ferroelectric memory technology is based on hafnium oxide (HfO) materials; meaning that after $10^6$ cycles, its operational efficiency will begin to degrade, which does not meet the needs of industry.

SUMMARY

In accordance with one embodiment of the disclosure, a ferroelectric memory is provided. The ferroelectric memory includes a first electrode layer having a dominant crystallographic orientation of (110) or (220); a second electrode layer opposite the first electrode layer, wherein the second electrode layer has a dominant crystallographic orientation of (110) or (220); and a ferroelectric layer disposed between the first electrode layer and the second electrode layer, wherein the ferroelectric layer has a dominant crystallographic orientation of (111).

In one embodiment, the disclosed ferroelectric memory further includes a stress layer disposed above the first electrode layer or the second electrode layer. In one embodiment, the stress layer includes semiconductor materials, dielectric materials, conductive dielectric materials or metal materials.

In accordance with one embodiment of the disclosure, a ferroelectric memory is provided. The ferroelectric memory includes a substrate; a first conductive layer disposed on the substrate; a patterned oxide layer disposed on the first conductive layer and the substrate, exposing a part of the first conductive layer; a second conductive layer disposed on the exposed first conductive layer and the patterned oxide layer; a first electrode layer disposed on the exposed first conductive layer and the second conductive layer, wherein the first electrode layer has a dominant crystallographic orientation of (110) or (220); a ferroelectric layer disposed on the first electrode layer, wherein the ferroelectric layer has a dominant crystallographic orientation of (111); a second electrode layer disposed on the ferroelectric layer, wherein the second electrode layer has a dominant crystallographic orientation of (110) or (220); a stress layer disposed between the second electrode layer; and a third conductive layer disposed on the stress layer and the second electrode layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is determined by reference to the appended claims.

In order to increase the number of operations that can be performed within the product lifespan of a ferroelectric memory, the disclosure provides a ferroelectric memory. Using an environmental stress design in structures and arranging electrode layers in a specific crystallographic orientation, a ferroelectric memory with a nearly wake-up free behavior is formed.

Figure 1:
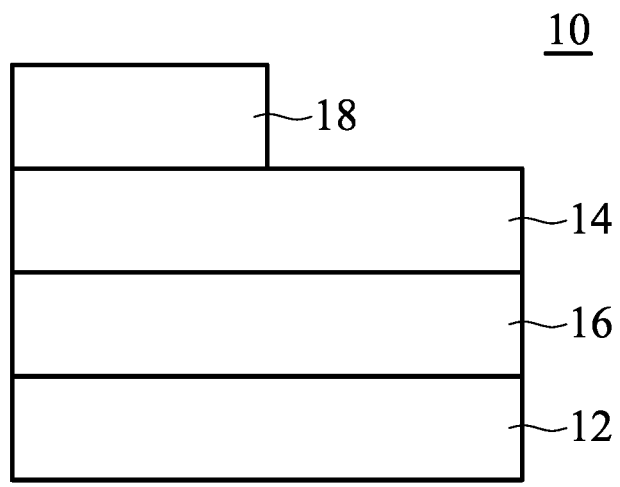
FIG. 1 is a cross-sectional view of a ferroelectric memory in accordance with one embodiment of the disclosure.

Referring to FIG. 1, in accordance with one embodiment of the disclosure, a ferroelectric memory 10 is provided. FIG. 1 is a cross-sectional view of the ferroelectric memory 10.

The ferroelectric memory (i.e. Ferroelectric RAM; FeRAM) 10 includes a first electrode layer 12, a second electrode layer 14 and a ferroelectric layer 16. The second electrode layer 14 is opposite the first electrode layer 12. The ferroelectric layer 16 is disposed between the first electrode layer 12 and the second electrode layer 14. The dominant crystallographic orientation of the first electrode layer 12 and the second electrode layer 14 includes (110) or (220). The dominant crystallographic orientation of the ferroelectric layer 16 includes (111).

In one embodiment, the first electrode layer 12 and the second electrode layer 14 may include the following materials: titanium nitride (TiN), but it is not limited thereto. In one embodiment, the first electrode layer 12 and the second electrode layer 14 may include cubic crystal systems. In one embodiment, the minor crystallographic orientation of the first electrode layer 12 and the second electrode layer 14 may include (001), (002), (111) or (200).

In one embodiment, the ferroelectric layer 16 may include the following materials: hafnium zirconium oxide ($HfZrO_x$) (the ratio of zirconium to hafnium zirconium oxide is between 40-60%), hafnium oxide ($HfO_x$), hafnium silicon oxide ($HfSiO_x$) (the ratio of silicon to hafnium silicon oxide is between 3-6%), hafnium aluminum oxide ($HfAlO_x$) (the ratio of aluminum to hafnium aluminum oxide is between 2-10%), hafnium gadolinium oxide ($HfGdO_x$) (the ratio of gadolinium to hafnium gadolinium oxide is between 2-50%), hafnium yttrium oxide ($HfYO_x$) (the ratio of yttrium to hafnium yttrium oxide is between 2-20%), hafnium strontium oxide ($HfSrO_x$) (the ratio of strontium to hafnium strontium oxide is between 2-40%), or hafnium zirconium lanthanum oxide ($HfZrLaO_x$) (the ratio of zirconium to hafnium zirconium lanthanum oxide is between 40-60%; the ratio of lanthanum to hafnium zirconium lanthanum oxide is between 0.1-2%). But it is not limited thereto. In one embodiment, the ferroelectric layer 16 may include an orthorhombic phase. In one embodiment, the minor crystallographic orientation of the ferroelectric layer 16 may include (002), (100), (110), (020), (211), (022), (220), (202), (113) or (311).

In one embodiment, the ferroelectric memory 10 further includes a stress layer 18 disposed above the second electrode layer 14. In one embodiment, the stress layer 18 may include semiconductor materials, dielectric materials, conductive dielectric materials or metal materials. In one embodiment, the stress layer 18 may include the following metal or semiconductor materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but it is not limited thereto. In one embodiment, the stress layer 18 may include the following dielectric or conductive dielectric materials, for example, zinc oxide (ZnO), titanium oxide (Ox), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$), but it is not limited thereto.

Figure 2:
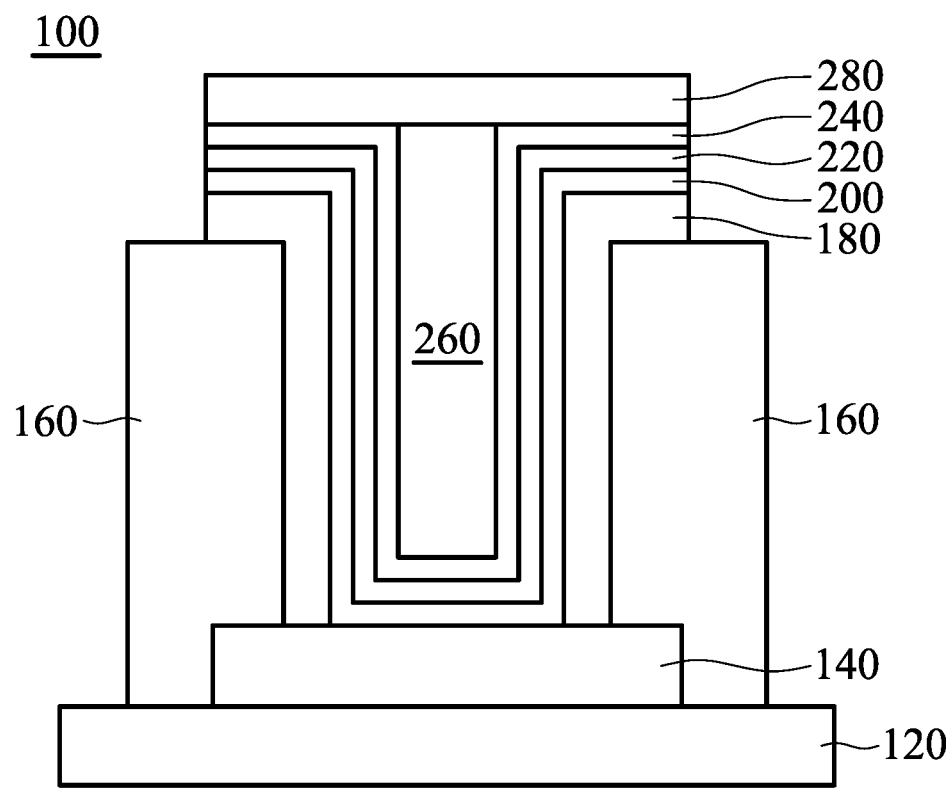
FIG. 2 is a cross-sectional view of a ferroelectric memory in accordance with one embodiment of the disclosure.

Referring to FIG. 2, in accordance with one embodiment of the disclosure, a ferroelectric memory 100 is provided. FIG. 2 is a cross-sectional view of the ferroelectric memory 100.

The ferroelectric memory (i.e. Ferroelectric RAM; FeRAM) 100 includes a substrate 120, a first conductive layer 140, a patterned oxide layer 160, a second conductive layer 180, a first electrode layer 200, a ferroelectric layer 220, a second electrode layer 240, a stress layer 260 and a third conductive layer 280. The first conductive layer 140 is disposed on the substrate 120. The patterned oxide layer 160 is disposed on the first conductive layer 140 and the substrate 120, and a part of the first conductive layer 140 is exposed. The second conductive layer 180 is disposed on the exposed first conductive layer 140 and the patterned oxide layer 160. The first electrode layer 200 is disposed on the exposed first conductive layer 140 and the second conductive layer 180, and the dominant crystallographic orientation of the first electrode layer 200 includes (110) or (220). The ferroelectric layer 220 is disposed on the first electrode layer 200, and the dominant crystallographic orientation of the ferroelectric layer 220 includes (111). The second electrode layer 240 is disposed on the ferroelectric layer 220, and the dominant crystallographic orientation of the second electrode layer 240 includes (110) or (220). The stress layer 260 is disposed between the second electrode layer 240. The third conductive layer 280 is disposed on the stress layer 260 and the second electrode layer 240.

In one embodiment, the patterned oxide layer 160 may include the following materials: silicon oxide, silicon nitride or silicon oxynitride. But it is not limited thereto.

In one embodiment, the first conductive layer 140, the second conductive layer 180 and the third conductive layer 280 may include semiconductor materials, conductive dielectric materials or metal materials. In one embodiment, the first conductive layer 140, the second conductive layer 180 and the third conductive layer 280 may include the following metal or semiconductor materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AN), yttrium (Y), gadolinium (Gd), strontium (Sr), tungsten (W), tungsten silicide (WSi), tungsten nitride (WN), gallium (Ga) or gallium nitride (GaN), but it is not limited thereto. In one embodiment, the first conductive layer 140, the second conductive layer 180 and the third conductive layer 280 may include the following conductive dielectric materials, for example, zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$), but it is not limited thereto.

In one embodiment, the first electrode layer 200 and the second electrode layer 240 may include titanium nitride (TiN), but it is not limited thereto. In one embodiment, the first electrode layer 200 and the second electrode layer 240 may include cubic crystal systems. In one embodiment, the minor crystallographic orientation of the first electrode layer 200 and the second electrode layer 240 may include (001), (002), (111) or (200).

In one embodiment, the ferroelectric layer 220 may include the following materials: hafnium zirconium oxide (HfZrO$_x$) (the ratio of zirconium to hafnium zirconium oxide is between 40-60%), hafnium oxide (HfO$_x$), hafnium silicon oxide (HfSiO$_x$) (the ratio of silicon to hafnium silicon oxide is between 3-6%), hafnium aluminum oxide (HfAlO$_x$) (the ratio of aluminum to hafnium aluminum oxide is between 2-10%), hafnium gadolinium oxide (HfGdO$_x$) (the ratio of gadolinium to hafnium gadolinium oxide is between 2-50%), hafnium yttrium oxide (HfYO$_x$) (the ratio of yttrium to hafnium yttrium oxide is between 2-20%), hafnium strontium oxide (HfSrO$_x$) (the ratio of strontium to hafnium strontium oxide is between 2-40%), or hafnium zirconium lanthanum oxide (HfZrLaO$_x$) (the ratio of zirconium to hafnium zirconium lanthanum oxide is between 40-60%; the ratio of lanthanum to hafnium zirconium lanthanum oxide is between 0.1-2%). But it is not limited thereto. In one embodiment, the ferroelectric layer 220 may include an orthorhombic phase. In one embodiment, the minor crystallographic orientation of the ferroelectric layer 220 may include (002), (100), (110), (020), (211), (022), (220), (202), (113) or (311).

In one embodiment, the stress layer 260 may include semiconductor materials, dielectric materials, conductive dielectric materials or metal materials. In one embodiment, the stress layer 260 may include the following metal or semiconductor materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but it is not limited thereto. In one embodiment, the stress layer 260 may include the following dielectric or conductive dielectric materials, for example, zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$), but it is not limited thereto.

Referring to FIGS. 3A-3E, in accordance with one embodiment of the disclosure, a method for fabricating a ferroelectric memory is provided. FIGS. 3A-3E are cross-sectional views of the method for fabricating a ferroelectric memory.

Figure 3A:
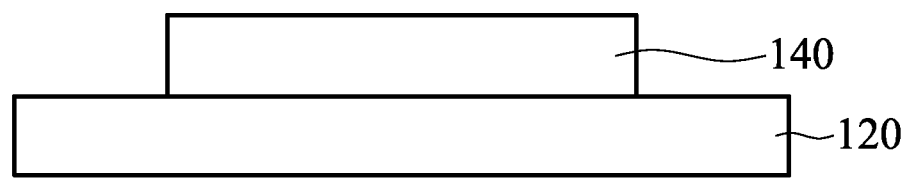
FIGS. 3A-3E are cross-sectional views of a method for fabricating a ferroelectric memory in accordance with one embodiment of the disclosure.

First, as shown in FIG. 3A, a substrate 120 with a first conductive layer 140 formed thereon is provided. In one embodiment, the first conductive layer 140 is deposited by, for example, plasma-enhanced chemical vapor deposition (PECVD), chemical vapor deposition (CVD) or atomic layer deposition (ALD).

Figure 3B:
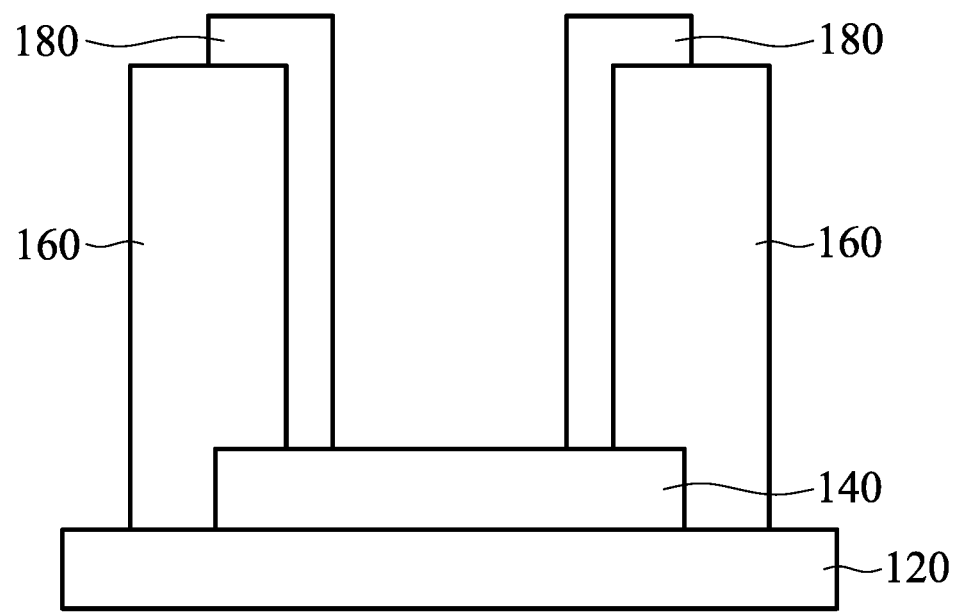

Next, as shown in FIG. 3B, a patterned oxide layer 160 is formed on the first conductive layer 140 and the substrate 120, and a part of the first conductive layer 140 is exposed. Next, a second conductive layer 180 is formed on the exposed first conductive layer 140 and the patterned oxide layer 160. In one embodiment, according to various aspect ratios of the opening of the patterned oxide layer 160, the second conductive layer 180 is deposited on the first conductive layer 140 and the patterned oxide layer 160 using different deposition processes. For example, when the aspect ratio of the opening is less than 3, the second conductive layer 180 is deposited by, for example, plasma-enhanced chemical vapor deposition (PECVD). When the aspect ratio of the opening is between 3 and 10, the second conductive layer 180 is deposited by, for example, chemical vapor deposition (CVD). When the aspect ratio of the opening is greater than 10, the second conductive layer 180 is deposited by, for example, atomic layer deposition (ALD).

Figure 3C:
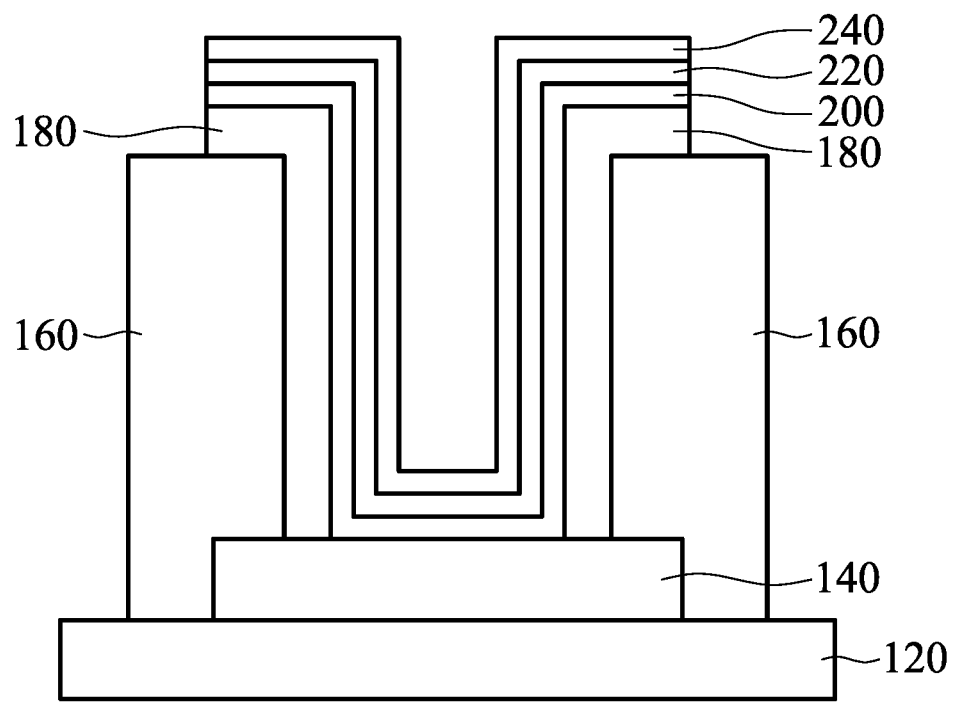

Next, as shown in FIG. 3C, a first electrode layer 200 is formed on the exposed first conductive layer 140 and the second conductive layer 180. In one embodiment, the first electrode layer 200 is deposited by, for example, physical vapor deposition (PVD), chemical vapor deposition (CVD) or atomic layer deposition (ALD). Next, a ferroelectric layer 220 is formed on the first electrode layer 200. In one embodiment, the ferroelectric layer 220 is deposited by, for example, atomic layer deposition (ALD). Next, a second electrode layer 240 is formed on the ferroelectric layer 220. In one embodiment, the second electrode layer 240 is deposited by, for example, physical vapor deposition (PVD), chemical vapor deposition (CVD) or atomic layer deposition (ALD).

Figure 3D:
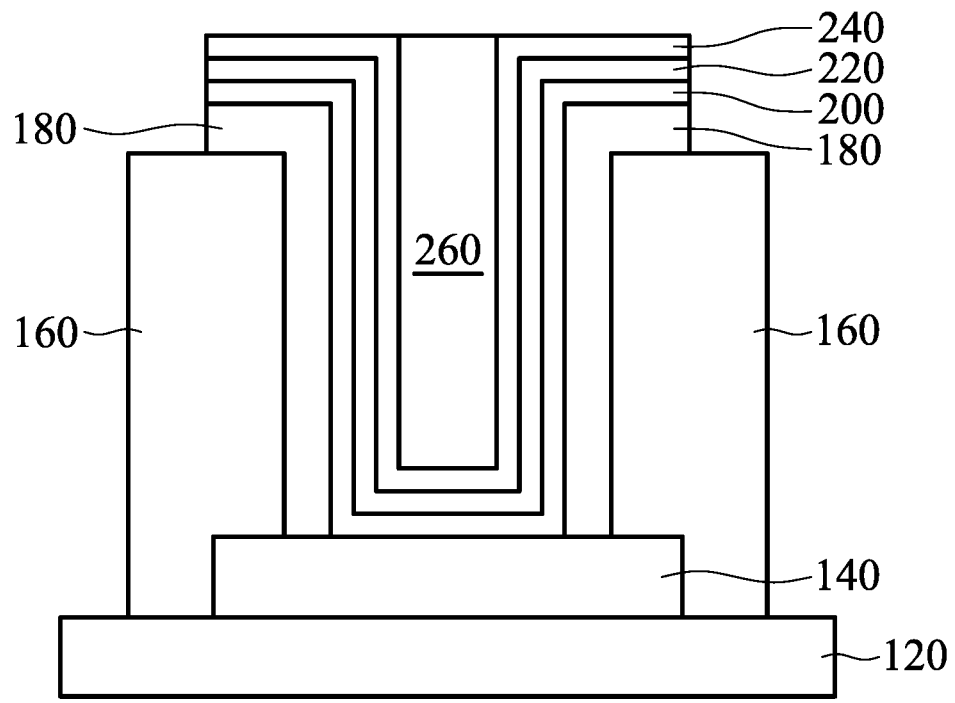

Next, as shown in FIG. 3D, a stress layer 260 is filled between the second electrode layer 240. In one embodiment, the stress layer 260 is deposited by, for example, chemical vapor deposition (CVD) or atomic layer deposition (ALD).

Figure 3E:
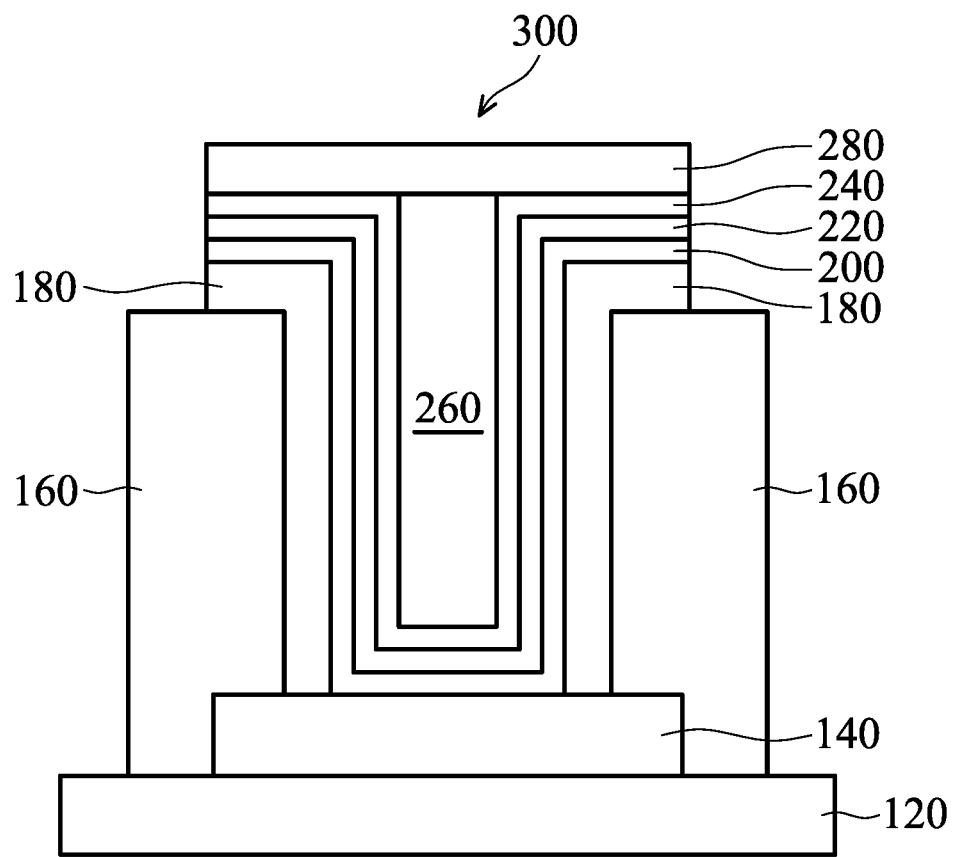

Next, as shown in FIG. 3E, a third conductive layer 280 is formed on the stress layer 260 and the second electrode layer 240. In one embodiment, the third conductive layer 280 is deposited by, for example, plasma-enhanced chemical vapor deposition (PECVD), chemical vapor deposition (CVD) or atomic layer deposition (ALD). Next, an annealing process 300 is performed. In one embodiment, the temperature of the annealing process 300 is in a range from about 350° C. to about 600° C. So far, the production of the ferroelectric memory of this embodiment is completed.

Example 1

Volume Percentages of Different Crystal Phases in the Ferroelectric Layer Under the Specific Conditions In this example, under the specific conditions, the volume percentages of the different crystal phases (including the monoclinic phase (M-phase), the orthorhombic phase (O-phase) and the tetragonal phase (T-phase)) in the ferroelectric layers of the provided ferroelectric memory I, ferroelectric memory II and ferroelectric memory III were acknowledged. The monoclinic phase (M-phase) corresponded to the dielectric properties, the orthorhombic phase (O-phase) corresponded to the ferroelectric properties, and the tetragonal phase (T-phase) corresponded to the antiferroelectric properties. The device structure of ferroelectric memory I, ferroelectric memory II and ferroelectric memory III are shown in FIG. 1. In ferroelectric memory I, the ferroelectric layer was composed of hafnium zirconium oxide (HfZrO$_x$), the first and second electrode layers were composed of titanium nitride (TiN), and the dominant crystallographic orientation of the first and second electrode layers was (100). In ferroelectric memory II, the ferroelectric layer was composed of hafnium zirconium oxide (HfZrO$_x$), the first and second electrode layers were composed of titanium nitride (TiN), and the dominant crystallographic orientation of the first and second electrode layers was (111). In ferroelectric memory III, the ferroelectric layer was composed of hafnium zirconium oxide (HfZrO$_x$), the first and second electrode layers were composed of titanium nitride (TiN), and the dominant crystallographic orientation of the first and second electrode layers was (110). Under the conditions that the arranged electrode layers had the specific crystallographic orientations, and the electric field strength of 2.5 MV/cm and a stress of 1 GPa were applied, the crystal grains in each ferroelectric layer were changed in crystalline behavior, so that the volume percentages of the different crystal phases in the ferroelectric layers of the provided ferroelectric memory I, ferroelectric memory II and ferroelectric memory III were obtained. The values are shown in Table 1.

TABLE 1

| | Ferroelectric memory I | Ferroelectric memory II | Ferroelectric memory III |
|---|---|---|---|
| | Electrode layers (crystallographic orientation) | | |
| Crystal phases in the ferroelectric layer | TiN (100) | TiN (111) | TiN (110) |
| | Volume percentage (%) | | |
| M-phase | 80 | 70 | 13 |
| O-phase | 13 | 23 | 81 |
| T-phase | 7 | 7 | 6 |

It can be seen from Table 1 that, under the above test conditions, in the ferroelectric layer of ferroelectric memory I (wherein the dominant crystallographic orientation of the titanium nitride (TiN) electrode layer was (100)), the monoclinic phase (M-phase) accounted for the highest volume percentage (up to 80%), and the orthorhombic phase (O-phase) accounted for 13%, which indicated that the ferroelectric layer of ferroelectric memory I had more dielectric properties at that time. In the ferroelectric layer of ferroelectric memory II (wherein the dominant crystallographic orientation of the titanium nitride (TiN) electrode layer was (111)), the monoclinic phase (M-phase) accounted for the highest volume percentage (up to 70%), and the orthorhombic phase (O-phase) accounted for 23%, which indicated that the ferroelectric layer of ferroelectric memory II also had more dielectric properties at that time. However, in the ferroelectric layer of the disclosed ferroelectric memory III (wherein the dominant crystallographic orientation of the titanium nitride (TiN) electrode layer was (110)), the orthorhombic phase (O-phase) accounted for the highest volume percentage (up to 81%), which indicated that the ferroelectric layer of ferroelectric memory III had more ferroelectric properties at that time, and such properties were beneficial to the operation of the device.

Example 2

The Relationship Between the Number of Operations and the Remanent Polarization (Pr) of the Ferroelectric Memory According to the structural configuration of the device shown in this example, which is Example 1, variations in the remanent polarization (Pr) in the number of operations (cycles) of ferroelectric memory I and ferroelectric memory III were tested under certain conditions, including having an electric field strength of 2.5 MV/cm and a stress of 1 GPa applied. The results are shown in FIG. 4.

Figure 4:
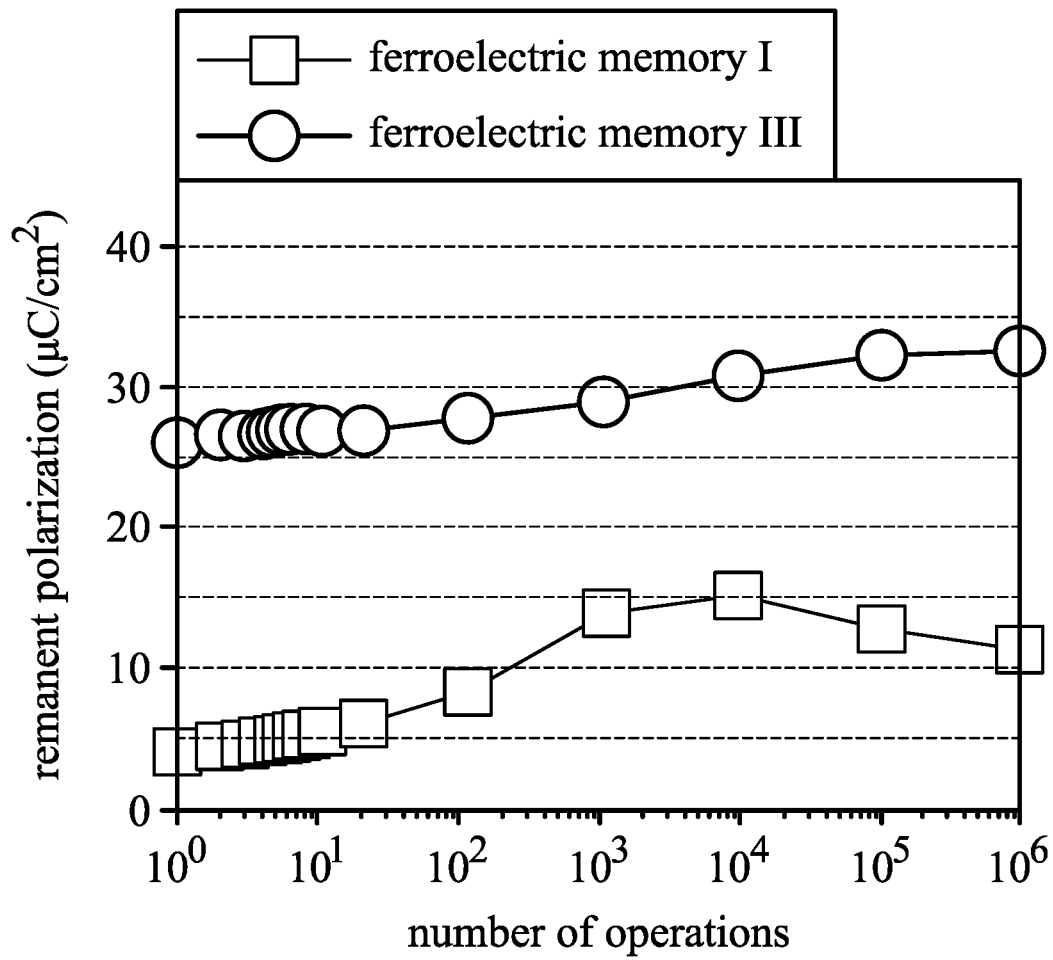
FIG. 4 shows the relationship between the number of operations and the remanent polarization (Pr) of a ferroelectric memory in accordance with one embodiment of the disclosure.

It can be seen in FIG. 4 that, under the above test conditions, when the number of operations was gradually increased, the variations of the remanent polarization (Pr) of ferroelectric memory I (wherein the dominant crystallographic orientation of the titanium nitride (TiN) electrode layer was (100)) with the increase in the number of operations exhibited a significant wake-up behavior. When the number of operations was increased to 104, the fatigue effect began to occur. However, in the disclosed ferroelectric memory III (wherein the dominant crystallographic orientation of the titanium nitride (TiN) electrode layer was (110)), during the operation of the device, its remanent polarization (Pr) was not only much higher than that of ferroelectric memory I, even when the number of operations increased up to $10^6$, the value of its remanent polarization (Pr) still maintained, which presented the so-called nearly wake-up free behavior, and this feature will be quite helpful to increase the number of operations of the device to $10^{10}$ or more.

In the disclosure, a high-strength environmental stress is generated around the ferroelectric layer by creating the environmental stress in the device structure (that is, the configuration of the stress layer). On the other hand, the electrode layers having specific materials and the crystallographic orientations are arranged on the both sides of the ferroelectric layer. For example, the electrode layer is composed of titanium nitride (TiN), and its dominant crystallographic orientation is (110). The orthorhombic phase (O-phase) has a higher volume percentage than either the monoclinic phase (M-phase) or the tetragonal phase (T-phase). Use of the orthorhombic phase (O-phase) promotes more and stable ferroelectric properties in the ferroelectric layer of the disclosed ferroelectric memory. Stable ferroelectric properties are beneficial to the operation of the device, and can slow down deterioration. As a result, the number of operations of the device may be effectively increased to $10^{10}$ or more.

While the disclosure has been described by way of example and in terms of embodiments, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A ferroelectric memory, comprising:
   a first electrode layer having a dominant crystallographic orientation of (110) or (220);
   a second electrode layer opposite the first electrode layer, wherein the second electrode layer has a dominant crystallographic orientation of (110) or (220); and
   a ferroelectric layer disposed between the first electrode layer and the second electrode layer, wherein the ferroelectric layer has a dominant crystallographic orientation of (111).

2. The ferroelectric memory as claimed in claim 1, wherein the first electrode layer and the second electrode layer comprise titanium nitride.

3. The ferroelectric memory as claimed in claim 1, wherein the first electrode layer and the second electrode layer comprise cubic crystal systems.

4. The ferroelectric memory as claimed in claim 1, wherein the first electrode layer and the second electrode layer have a minor crystallographic orientation of (001), (002), (111) or (200).

5. The ferroelectric memory as claimed in claim 1, wherein the ferroelectric layer comprises hafnium zirconium oxide ($HfZrO_x$) (the ratio of zirconium to hafnium zirconium oxide is between 40-60%), hafnium oxide ($HfO_x$), hafnium silicon oxide ($HfSiO_x$) (the ratio of silicon to hafnium silicon oxide is between 3-6%), hafnium aluminum oxide ($HfAlO_x$) (the ratio of aluminum to hafnium aluminum oxide is between 2-10%), hafnium gadolinium oxide ($HfGdO_x$) (the ratio of gadolinium to hafnium gadolinium oxide is between 2-50%), hafnium yttrium oxide ($HfYO_x$) (the ratio of yttrium to hafnium yttrium oxide is between 2-20%), hafnium strontium oxide ($HfSrO_x$) (the ratio of strontium to hafnium strontium oxide is between 2-40%), or hafnium zirconium lanthanum oxide ($HfZrLaO_x$) (the ratio of zirconium to hafnium zirconium lanthanum oxide is between 40-60%; the ratio of lanthanum to hafnium zirconium lanthanum oxide is between 0.1-2%).

6. The ferroelectric memory as claimed in claim 1, wherein the ferroelectric layer comprises an orthorhombic phase.

7. The ferroelectric memory as claimed in claim 1, wherein the ferroelectric layer has a minor crystallographic orientation of (002), (100), (110), (020), (211), (022), (220), (202), (113) or (311).

8. The ferroelectric memory as claimed in claim 1, further comprising a stress layer disposed above the first electrode layer or the second electrode layer.

9. The ferroelectric memory as claimed in claim 8, wherein the stress layer comprises semiconductor materials, dielectric materials, conductive dielectric materials or metal materials.

10. The ferroelectric memory as claimed in claim 9, wherein the stress layer comprises zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN).

11. The ferroelectric memory as claimed in claim 9, wherein the stress layer comprises zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$).

12. A ferroelectric memory, comprising:
a substrate;
a first conductive layer disposed on the substrate;
a patterned oxide layer disposed on the first conductive layer and the substrate, exposing a part of the first conductive layer;
a second conductive layer disposed on the exposed first conductive layer and the patterned oxide layer;
a first electrode layer disposed on the exposed first conductive layer and the second conductive layer, wherein the first electrode layer has a dominant crystallographic orientation of (110) or (220);
a ferroelectric layer disposed on the first electrode layer, wherein the ferroelectric layer has a dominant crystallographic orientation of (111);
a second electrode layer disposed on the ferroelectric layer, wherein the second electrode layer has a dominant crystallographic orientation of (110) or (220);
a stress layer disposed between the second electrode layer; and
a third conductive layer disposed on the stress layer and the second electrode layer.

13. The ferroelectric memory as claimed in claim 12, wherein the first conductive layer, the second conductive layer and the third conductive layer comprise semiconductor materials, conductive dielectric materials or metal materials.

14. The ferroelectric memory as claimed in claim 12, wherein the patterned oxide layer comprises silicon oxide, silicon nitride or silicon oxynitride.

15. The ferroelectric memory as claimed in claim 12, wherein the first electrode layer and the second electrode layer comprise titanium nitride.

16. The ferroelectric memory as claimed in claim 12, wherein the first electrode layer and the second electrode layer comprise cubic crystal systems.

17. The ferroelectric memory as claimed in claim 12, wherein the first electrode layer and the second electrode layer have a minor crystallographic orientation of (001), (002), (111) or (200).

18. The ferroelectric memory as claimed in claim 12, wherein the ferroelectric layer comprises hafnium zirconium oxide (HfZrO$_x$) (the ratio of zirconium to hafnium zirconium oxide is between 40-60%), hafnium oxide (HfO$_x$), hafnium silicon oxide (HfSiO$_x$) (the ratio of silicon to hafnium silicon oxide is between 3-6%), hafnium aluminum oxide (HfAlO$_x$) (the ratio of aluminum to hafnium aluminum oxide is between 2-10%), hafnium gadolinium oxide (HfGdO$_x$) (the ratio of gadolinium to hafnium gadolinium oxide is between 2-50%), hafnium yttrium oxide (HfYO$_x$) (the ratio of yttrium to hafnium yttrium oxide is between 2-20%), hafnium strontium oxide (HfSrO$_x$) (the ratio of strontium to hafnium strontium oxide is between 2-40%), or hafnium zirconium lanthanum oxide (HfZrLaO$_x$) (the ratio of zirconium to hafnium zirconium lanthanum oxide is between 40-60%; the ratio of lanthanum to hafnium zirconium lanthanum oxide is between 0.1-2%).

19. The ferroelectric memory as claimed in claim 12, wherein the ferroelectric layer comprises an orthorhombic phase.

20. The ferroelectric memory as claimed in claim 12, wherein the ferroelectric layer has a minor crystallographic orientation of (002), (100), (110), (020), (211), (022), (220), (202), (113) or (311).

21. The ferroelectric memory as claimed in claim 12, wherein the stress layer comprises semiconductor materials, dielectric materials, conductive dielectric materials or metal materials.

22. The ferroelectric memory as claimed in claim 21, wherein the stress layer comprises zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN).

23. The ferroelectric memory as claimed in claim 21, wherein the stress layer comprises zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$).

* * * * *